(12) United States Patent
Aitken et al.

(10) Patent No.: US 7,722,929 B2
(45) Date of Patent: *May 25, 2010

(54) SEALING TECHNIQUE FOR DECREASING THE TIME IT TAKES TO HERMETICALLY SEAL A DEVICE AND THE RESULTING HERMETICALLY SEALED DEVICE

(75) Inventors: Bruce Gardiner Aitken, Corning, NY (US); Chong Pyung An, Painted Post, NY (US); Mark Alejandro Quesada, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 82 days.

This patent is subject to a terminal disclaimer.

(21) Appl. No.: 11/820,855

(22) Filed: Jun. 21, 2007

(65) Prior Publication Data

US 2007/0252526 A1    Nov. 1, 2007

Related U.S. Application Data

(63) Continuation-in-part of application No. 11/207,691, filed on Aug. 18, 2005, and a continuation-in-part of application No. 11/803,512, filed on May 15, 2007.

(51) Int. Cl.
*B05D 3/02* (2006.01)
*C23C 14/00* (2006.01)

(52) U.S. Cl. ............ 427/376.1; 427/372.2; 204/192.29; 204/298.12

(58) Field of Classification Search ............ 204/192.29, 204/298.12
See application file for complete search history.

(56) References Cited

U.S. PATENT DOCUMENTS 3,622,439 A   11/1971  Manne et al ............... 161/184

| | | |
|---|---|---|
| 3,720,097 A | 3/1973 | Kron ............................. 73/55 |
| 3,795,976 A | 3/1974 | Ikeda |
| 3,916,048 A | 10/1975 | Walles ......................... 428/35 |
| 3,932,693 A | 1/1976 | Shaw et al. ................. 428/518 |

(Continued)

FOREIGN PATENT DOCUMENTS

DE          2431917          1/1976

(Continued)

OTHER PUBLICATIONS

Kolosov, D., et al., Direct observation of structural changes in organic light emitting devices during degradation. Journal of Applied Physics, 1001. 90(7).

(Continued)

*Primary Examiner*—Shamim Ahmed
(74) *Attorney, Agent, or Firm*—William J. Tucker; Kevin M. Able

(57) ABSTRACT

A sealing method for decreasing the time it takes to hermetically seal a device and the resulting hermetically sealed device (e.g., a hermetically sealed OLED device) are described herein. The sealing method includes the steps of: (1) cooling an un-encapsulated device; (2) depositing a sealing material over at least a portion of the cooled device to form an encapsulated device; and (3) heat treating the encapsulated device to form a hermetically sealed device. In one embodiment, the sealing material is a low liquidus temperature inorganic (LLT) material such as, for example, tin-fluorophosphate glass, tungsten-doped tin fluorophosphate glass, chalcogenide glass, tellurite glass, borate glass and phosphate glass. In another embodiment, the sealing material is a $Sn^{2+}$-containing inorganic oxide material such as, for example, SnO, $SnO+P_2O_5$ and $SnO+BPO_4$.

11 Claims, 2 Drawing Sheets

U.S. PATENT DOCUMENTS

| | | | |
|---|---|---|---|
| 4,040,874 A | 8/1977 | Yerman | |
| 4,077,588 A | 3/1978 | Hurst | 244/31 |
| 4,314,031 A | 2/1982 | Sanford et al. | 501/44 |
| 4,374,391 A | 2/1983 | Camlibel et al. | 357/17 |
| 4,379,070 A | 4/1983 | Tick | 252/301.16 |
| 4,702,963 A | 10/1987 | Phillips et al. | 428/426 |
| 4,740,412 A | 4/1988 | Hocker et al. | 428/194 |
| 4,802,742 A | 2/1989 | Ichikawa et al. | 350/339 |
| 4,859,513 A | 8/1989 | Gibbons et al. | 428/34.2 |
| 5,084,356 A | 1/1992 | Deak et al. | 428/458 |
| 5,089,446 A * | 2/1992 | Cornelius et al. | 501/15 |
| 5,110,637 A | 5/1992 | Ando et al. | 428/34 |
| 5,110,668 A | 5/1992 | Minnick | 428/215 |
| 5,180,476 A * | 1/1993 | Ishibashi et al. | 204/192.29 |
| 5,183,684 A | 2/1993 | Carpenter | 427/574 |
| 5,211,995 A | 5/1993 | Kuehnle et al. | 427/570 |
| 5,324,572 A | 6/1994 | Kuechler et al. | 428/215 |
| 5,407,713 A | 4/1995 | Wilfong et al. | 428/34.1 |
| 5,462,779 A | 10/1995 | Misiano et al. | 428/34.7 |
| 5,478,618 A | 12/1995 | Rosen | 428/35.4 |
| 5,567,488 A | 10/1996 | Allen et al. | 428/34.1 |
| 5,610,742 A | 3/1997 | Hinata et al. | 349/122 |
| 5,641,559 A | 6/1997 | Namiki | 408/216 |
| 5,645,923 A | 7/1997 | Matsuo et al. | 428/216 |
| 5,736,207 A | 4/1998 | Walther et al. | 428/34.7 |
| 5,792,550 A | 8/1998 | Phillips et al. | 428/336 |
| 5,900,285 A | 5/1999 | Walther et al. | 427/491 |
| 6,077,928 A | 6/2000 | Suh et al. | 528/170 |
| 6,083,313 A | 7/2000 | Venkatraman et al. | 106/287.14 |
| 6,162,892 A | 12/2000 | Kobayashi et al. | 528/310 |
| 6,171,703 B1 | 1/2001 | Haluska | 428/446 |
| 6,193,379 B1 | 2/2001 | Tonar et al. | 359/603 |
| 6,207,488 B1 | 3/2001 | Hwang et al. | 438/240 |
| 6,211,560 B1 | 4/2001 | Jimenez et al. | 257/451 |
| 6,235,579 B1 | 5/2001 | Lou | 438/253 |
| 6,249,014 B1 | 6/2001 | Bailey | 257/295 |
| 6,268,695 B1 | 7/2001 | Affinito | 313/504 |
| 6,271,150 B1 | 8/2001 | Croswell et al. | 438/760 |
| 6,288,415 B1 | 9/2001 | Leong et al. | 257/94 |
| 6,294,420 B1 | 9/2001 | Tsu et al. | 438/239 |
| 6,306,783 B1 * | 10/2001 | Yamanaka | 501/15 |
| 6,321,571 B1 | 11/2001 | Themont et al. | 65/155 |
| 6,350,529 B1 | 2/2002 | Germain et al. | 428/476.3 |
| 6,355,125 B1 | 3/2002 | Tahon et al. | 156/99 |
| 6,403,176 B1 | 6/2002 | Patouraux et al. | 428/35.2 |
| 6,413,645 B1 | 7/2002 | Graff et al. | 428/446 |
| 6,465,101 B1 | 10/2002 | MacGregor et al. | 428/412 |
| 6,486,549 B1 | 11/2002 | Chiang | 257/723 |
| 6,492,026 B1 | 12/2002 | Graff et al. | 428/411.1 |
| 6,522,067 B1 | 2/2003 | Graff et al. | 313/512 |
| 6,524,698 B1 | 2/2003 | Schmoock | 428/336 |
| 6,528,442 B1 * | 3/2003 | Kuwano et al. | 501/41 |
| 6,530,477 B1 | 3/2003 | Martorano et al. | 206/524.2 |
| 6,623,861 B2 | 9/2003 | Martin et al. | 428/412 |
| 6,635,989 B1 * | 10/2003 | Nilsson et al. | 313/512 |
| 6,660,409 B1 | 12/2003 | Komatsu et al. | 428/690 |
| 6,664,730 B2 | 12/2003 | Weaver | 313/504 |
| 6,720,097 B2 | 4/2004 | Ohkawa et al. | 428/701 |
| 6,720,203 B2 | 4/2004 | Carcia et al. | 438/99 |
| 6,740,394 B2 | 5/2004 | Jacobsen et al. | 428/216 |
| 6,866,901 B2 | 3/2005 | Burrows et al. | 428/1.5 |
| 6,873,101 B2 | 3/2005 | Nilsson et al. | 313/512 |
| 6,991,506 B2 | 1/2006 | Yamada et al. | 445/24 |
| 7,015,640 B2 | 3/2006 | Schaepkens et al. | 313/506 |
| 7,034,457 B2 | 4/2006 | Iwase et al. | 313/512 |
| 7,045,951 B2 | 5/2006 | Kawase et al. | 313/504 |
| 7,126,269 B2 | 10/2006 | Yamada | 313/504 |
| 7,169,003 B2 | 1/2007 | Iwase et al. | 445/23 |
| 7,198,832 B2 | 4/2007 | Burrows et al. | 428/1.5 |
| 2001/0005585 A1 | 6/2001 | Ashihara et al. | 435/7.95 |
| 2001/0013756 A1 | 8/2001 | Mori et al. | 313/512 |
| 2001/0033135 A1 | 10/2001 | Duggal et al. | 313/506 |
| 2001/0038894 A1 | 11/2001 | Komada | 428/34.6 |
| 2001/0054436 A1 | 12/2001 | Mukai et al. | 136/256 |
| 2002/0013042 A1 | 1/2002 | Morkoc | 438/604 |
| 2002/0037418 A1 | 3/2002 | Peiffer et al. | 428/458 |
| 2002/0041443 A1 | 4/2002 | Varaprasad et al. | 359/603 |
| 2002/0074553 A1 | 6/2002 | Starikov et al. | 257/77 |
| 2002/0076154 A1 | 6/2002 | Maisenhoelder et al. | 385/37 |
| 2002/0110692 A1 | 8/2002 | Suzuki et al. | 428/411.1 |
| 2002/0114937 A1 | 8/2002 | Albert et al. | 428/304.4 |
| 2002/0122649 A1 | 9/2002 | Shimizu et al. | 385/129 |
| 2002/0127341 A1 | 9/2002 | Li | 427/385.5 |
| 2002/0140347 A1 | 10/2002 | Weaver | 313/506 |
| 2002/0142116 A1 | 10/2002 | Jud et al. | 428/35.3 |
| 2002/0160137 A1 | 10/2002 | Varma | 428/35.7 |
| 2002/0180924 A1 | 12/2002 | Sobrinho | 349/158 |
| 2003/0000826 A1 | 1/2003 | Krempel-Hesse et al. | 204/173 |
| 2003/0006697 A1 | 1/2003 | Weaver | 313/503 |
| 2003/0017297 A1 * | 1/2003 | Song et al. | 428/68 |
| 2003/0019517 A1 | 1/2003 | McFarland | 136/256 |
| 2003/0020099 A1 | 1/2003 | Taylor | 257/215 |
| 2003/0022919 A1 | 1/2003 | Ayers et al. | 512/317 |
| 2003/0032039 A1 | 2/2003 | Cunningham et al. | 435/6 |
| 2003/0044552 A1 | 3/2003 | Komada | 428/35.7 |
| 2003/0047353 A1 | 3/2003 | Yamaguchi et al. | 174/260 |
| 2003/0049942 A1 | 3/2003 | Haukka et al. | 438/778 |
| 2003/0068534 A1 | 4/2003 | Ohkawa et al. | 428/701 |
| 2003/0075753 A1 | 4/2003 | Chu | 257/308 |
| 2003/0080678 A1 | 5/2003 | Kim et al. | 313/504 |
| 2003/0085652 A1 | 5/2003 | Weaver | 313/506 |
| 2003/0087513 A1 | 5/2003 | Noguchi et al. | 438/627 |
| 2003/0143423 A1 | 7/2003 | McCormick et al. | 428/690 |
| 2003/0152803 A1 | 8/2003 | Acchione | 428/690 |
| 2003/0155151 A1 | 8/2003 | Hermanns et al. | 174/260 |
| 2003/0155860 A1 | 8/2003 | Choi et al. | 313/498 |
| 2003/0165696 A1 | 9/2003 | Namiki et al. | 428/446 |
| 2003/0183915 A1 | 10/2003 | Scheifers et al. | 257/682 |
| 2003/0184219 A1 | 10/2003 | Duggal et al. | 313/506 |
| 2003/0184291 A1 | 10/2003 | Duggal et al. | 313/506 |
| 2003/0192587 A1 | 10/2003 | Guzman et al. | |
| 2003/0193057 A1 | 10/2003 | Humbs et al. | 257/88 |
| 2003/0193286 A1 | 10/2003 | Ottermann et al. | 313/506 |
| 2003/0197197 A1 | 10/2003 | Brown et al. | 257/200 |
| 2003/0203210 A1 | 10/2003 | Graff et al. | 428/412 |
| 2003/0207500 A1 | 11/2003 | Pichler et al. | 438/127 |
| 2003/0214612 A1 | 11/2003 | Freeman | 349/12 |
| 2003/0219632 A1 | 11/2003 | Schaepkens | 428/698 |
| 2003/0234180 A1 | 12/2003 | Shimizu et al. | 205/80 |
| 2004/0019596 A1 | 1/2004 | Taylor et al. | 707/100 |
| 2004/0021820 A1 | 2/2004 | Sobrinho | 349/158 |
| 2004/0033379 A1 | 2/2004 | Grunlan et al. | 428/515 |
| 2004/0046497 A1 | 3/2004 | Schaepkens et al. | 313/506 |
| 2004/0046500 A1 | 3/2004 | Stegamat | 313/512 |
| 2004/0051449 A1 | 3/2004 | Klausmann et al. | 313/512 |
| 2004/0067604 A1 | 4/2004 | Ouellet et al. | 438/108 |
| 2004/0075382 A1 | 4/2004 | Stegamat et al. | 313/506 |
| 2004/0092095 A1 | 5/2004 | Nguyen et al. | 438/627 |
| 2004/0097005 A1 | 5/2004 | Daniels et al. | 438/99 |
| 2004/0100176 A1 | 5/2004 | Pichler | 313/112 |
| 2004/0113542 A1 * | 6/2004 | Hsiao et al. | 313/504 |
| 2004/0113543 A1 | 6/2004 | Daniels | 313/504 |
| 2004/0115361 A1 | 6/2004 | Aegerter et al. | 427/430.1 |
| 2004/0119403 A1 | 6/2004 | McCormick et al. | 313/506 |
| 2004/0121586 A1 | 6/2004 | Abell | 438/637 |
| 2004/0132606 A1 | 7/2004 | Wolf et al. | 501/66 |
| 2004/0135268 A1 | 7/2004 | Frischknecht | 257/788 |
| 2004/0135503 A1 | 7/2004 | Handa et al. | 313/511 |
| 2004/0140766 A1 | 7/2004 | Nilsson et al. | 313/512 |
| 2004/0151934 A1 | 8/2004 | Schwark et al. | 428/515 |
| 2004/0157426 A1 | 8/2004 | Ouellet et al. | 438/618 |
| 2004/0166239 A1 | 8/2004 | Ohkawa et al. | 427/248.1 |
| 2004/0174115 A1 | 9/2004 | Czeremuszkin et al. | 313/504 |
| 2004/0195960 A1 | 10/2004 | Czeremuszkin et al. | 313/504 |

| | | | | |
|---|---|---|---|---|
| 2004/0195967 A1* | 10/2004 | Padiyath et al. | ............. | 313/512 |
| 2004/0197489 A1 | 10/2004 | Heuser et al. | ................ | 427/535 |
| 2004/0201027 A1 | 10/2004 | Ghosh | ......................... | 257/99 |
| 2004/0201348 A1 | 10/2004 | Anandan | ..................... | 313/512 |
| 2004/0206953 A1 | 10/2004 | Morena et al. | ................. | 257/40 |
| 2004/0207314 A1 | 10/2004 | Aitken et al. | ................. | 313/504 |
| 2004/0209126 A1 | 10/2004 | Ziegler et al. | ................ | 428/702 |
| 2004/0229051 A1 | 11/2004 | Schaepkens et al. | ......... | 428/447 |
| 2004/0234797 A1 | 11/2004 | Schwark et al. | ........... | 428/474.4 |
| 2004/0239241 A1 | 12/2004 | Wittmann et al. | ............ | 313/511 |
| 2004/0245531 A1* | 12/2004 | Fuii et al. | ....................... | 257/88 |
| 2004/0258893 A1 | 12/2004 | Penttinen et al. | ............. | 428/212 |
| 2005/0012448 A1 | 1/2005 | Ke et al. | ...................... | 313/504 |
| 2005/0051763 A1 | 3/2005 | Affinito et al. | .................. | 257/3 |
| 2005/0153069 A1* | 7/2005 | Tapphorn et al. | ............. | 427/180 |
| 2005/0241815 A1 | 11/2005 | Caze et al. | | |
| 2007/0252526 A1 | 11/2007 | Aitken et al. | ................. | 313/512 |

FOREIGN PATENT DOCUMENTS

| | | | | |
|---|---|---|---|---|
| EP | 0225164 | 6/1987 | ..................... | 27/34 |
| EP | 0135924 | 9/1987 | ....................... | 27/8 |
| EP | 0151462 | 8/1990 | ..................... | 27/32 |
| EP | 0288972 | 9/1993 | ..................... | 27/34 |
| EP | 0394519 | 2/1994 | ..................... | 1/133 |
| EP | 0588667 | 3/1994 | ..................... | 27/32 |
| EP | 0638939 | 2/1995 | | |
| EP | 0494594 | 10/1995 | ..................... | 65/40 |
| EP | 0705757 | 4/1996 | ....................... | 1/40 |
| EP | 0744285 | 12/1999 | ..................... | 27/32 |
| EP | 0701897 | 4/2001 | ....................... | 27/8 |
| EP | 1118459 | 7/2001 | ..................... | 27/32 |
| EP | 1207572 | 5/2002 | | |
| EP | 1278244 | 2/2003 | | |
| EP | 0895013 | 8/2003 | ..................... | 11/12 |
| EP | 0977469 | 9/2003 | | |
| EP | 0726579 | 11/2003 | | |
| EP | 0775328 | 3/2004 | | |
| EP | 1420041 | 5/2004 | ......................... | 7/4 |
| EP | 1442067 | 8/2004 | ..................... | 18/76 |
| EP | 0787824 | 9/2004 | ..................... | 16/40 |
| EP | 1410902 | 4/2006 | ..................... | 27/34 |
| EP | 1 965 453 | 9/2008 | | |
| JP | 2004/010843 | 1/2001 | | |
| JP | 2003/020235 | 1/2003 | | |
| JP | 2003/275575 | 9/2003 | | |
| JP | 2004/018335 | 2/2004 | | |
| JP | 2005-306010 | 11/2005 | | |
| WO | WO93/22131 | 11/1993 | | |
| WO | WO97/22536 | 6/1997 | ..................... | 65/40 |
| WO | WO99/19229 | 4/1999 | ..................... | 65/42 |
| WO | WO 00/20536 | 4/2000 | | |
| WO | WO00/66794 | 11/2000 | ....................... | 7/20 |
| WO | WO 01/05205 | 1/2001 | | |
| WO | WO 01/65167 | 9/2001 | | |
| WO | WO 01/83067 | 11/2001 | | |
| WO | WO 02/36647 | 5/2002 | | |
| WO | WO03-087427 | 10/2003 | ..................... | 183/4 |
| WO | WO 2004/046767 | 6/2004 | | |
| WO | WO2004/054010 | 6/2004 | | |
| WO | WO 2004/079781 | 9/2004 | | |
| WO | WO 2004/094321 | 11/2004 | | |
| WO | WO 2004/095597 | 11/2004 | | |
| WO | WO2004/105149 | 12/2004 | ..................... | 51/10 |
| WO | WO2007/021627 | 2/2007 | | |

OTHER PUBLICATIONS

Liew, F.Y., et al., Investigation of the sites of dark spots in organic light-emitting devices. Applied Physics Letters, 1000. 77(17).

Forsythe, Eric, W., Operation of Organic-Based Light-Emitting Devices, in Society for Information Device (SID) 40$^{th}$ anniversary Seminar Lecture Notes, vol. 1, Seminar M5, Hynes Convention Center, Boston, MA, May 20 and 24, (1002).

Nisato, et al "P-88: Thin Film Encapsulation for OLEDs: Evaluation of Multi-layer Barriers using the Ca Test", SID 03 N. Digest, pp. 550-553.

U.S. Appl. No. 11/509,445, filed Aug. 24, 2006 titled "TIN Phosphate Barrier Film, Method, and Apparatus".

Young, R., *Flat panel display market outlook: From cyclicality to maturity*, in NPD Breakfast with the Experts, D. Ross Young—President, ditor. 2006, DisplaySearch, www.displaysearch.com.

Nisato, G., et al., *Evaluating high performance diffusion barriers: the calcium test*. In 8$^{th}$ International Display Workshop. 2001. Nagoya, Japan.

Burrows, P.E., et al., *Gas Permeation and Lifetime Tests on Polymer-Based Barrier Coatings*, in SPIE Annual Meeting. 2000, SPIE.

Walther et al; "Multilayer Barrier Coating System Produced by Plasma-Impulse Chemical Vapor Deposition (PICVD)"; Surface and Coatings Technology, vo. 80, pp. 200-202, 1996.

Giefers, H. et al; (2005), Kinetics of the disproportionation of $SnO_1$ Solid State Ionics 176, pp. 199-207, Elsevier.

Titova, Z.P. et al; 1964; Journal of Applied Chemistry USSR, 37 (10-12), pp. 2129.

PCT International Search Report for International Application No. PCT/US2006/030670 dated Dec. 19, 2006.

A. Köhler et al., "Fluorescence and Phosphorescence in Organic Materials", Advanced Engineering Materials, 2002, vol. 4, No. 7, pp. 453-459.

R.A. Mathies et al., "Optimization of High-Sensitivity Fluorescence Detection", Anal. Chem., 1990, vol. 62, pp. 1786-1791.

P.K.H. Ho et al., "All-Polymer Optoelectronic Devices", Science, vol. 285, Jul. 9, 1999, pp. 233-236.

H. Aziz et al., "Degradation Mechanism of Small Molecule-Based Organic Light-Emitting Devices", Science, Mar. 19, 1999, vol. 283, pp. 1900-1902.

P.E. Burrows et al., "Reliability and degradation of organic light emitting devices", Appl. Phys. Lett., vol. 65, No. 23, Dec. 5, 1994, pp. 2922-2924.

P.A. Tick et al., "Optical Waveguides from Low Melting Temperature Glasses with Organic Dyes", SPIE, vol. 1775, Nonlinear Optical Properties of Organic Materials V, 1992, pp. 391-401.

Hood Chatham, "Oxygen Diffusion Barrier Properties of Transparent Oxide Coatings on Polymeric Substrates", Surface and Coatings Technology, vol. 78, 1996, pp. 1-9.

D.B. Curliss et al., "Cure Reaction Pathways of Bismaleimide Polymers: A Solid-State $^{13}$N NMR Investigation", Macromolecules, 1998, vol. 31, pp. 6776-6782.

N. Regnier et al., "Solid-State $^{13}$C-NMR Study on Bismaleimide/ Diamine Polymerization: Structure, Control of Particle Size, and Mechanical Properties", Journal of Applied Polymer Science, vol. 78, 2000, pp. 2379-2388.

A. Ashok Kumar et al., "Synthesis and Characterization of Siliconized Epoxy-1, 3-bis(maleimido)benzene Intercrosslinked Matrix Materials", Polymer, vol. 43, 2002, pp. 693-702.

M. Sava, "Synthesis of Bismaleimides with Ester Units and Their Polymerization with Diamines", Journal of Applied Polymer Science, vol. 84, 2002, pp. 750-757.

MIT Internet Class 6.976, Lecture #7, "Special Topics in Flat Panel Display", Spring 2001, http://hackman.mit.edu \6976\ Lllandouts\Lecture%207.pdf\.

A.C. Misra et al., "Synthesis and properties of octafluoro-benzidine bis-maleimide and of it reaction products with fluorinated diamines", Polymer, 1992, vol. 33, No. 5, pp. 1083-1089.

A.C. Misra et al., "Synthesis and properties of some new fluorine-containing polyimides", Polymer, 1992, vol. 33, No. 5, pp. 1078-1082.

J.E. White et al., "Polymerization of N,N'-bismaleimido-4,4'-diphenylmethane with arenedithiols. Synthesis of some new polyimidosulphides", Polymer, 1984, vol. 25, pp. 850-854.

Gordon Graff et al. "Barrier Layer Technology for Flexible Displays", Flexible Flat Panel Displays, pp. 57-77.

* cited by examiner

SEALING TECHNIQUE FOR DECREASING THE TIME IT TAKES TO HERMETICALLY SEAL A DEVICE AND THE RESULTING HERMETICALLY SEALED DEVICE

This patent application is a continuation-in-part application of U.S. patent application Ser. No. 11/207,691 filed on Aug. 18, 2005 and entitled "Method for Inhibiting Oxygen and Moisture Degradation of a Device and the Resulting Device". In addition, this patent application is a continuation-in-part application of U.S. patent application Ser. No. 11/803,512 filed on May 15, 2007 and entitled "Low Temperature Sintering using $Sn^{2+}$Containing Inorganic Materials to Hermetically Seal a Device". The contents of these documents are hereby incorporated by reference herein.

TECHNICAL FIELD

The present invention relates to a sealing method for decreasing the time it takes to hermetically seal a device and the resulting hermetically sealed device. Examples of the hermetically sealed device include a light-emitting device (e.g., organic emitting light diode (OLED) device), a photovoltaic device, a thin-film sensor, an evanescent waveguide sensor, a food container and a medicine container.

BACKGROUND

Transport of oxygen and/or water through laminated or encapsulated materials and their subsequent attack of an inner material within a device represents two of the more common degradation mechanisms associated with many devices including, for example, light-emitting devices (OLED devices), thin-film sensors, evanescent waveguide sensors, food containers and medicine containers. For a detailed discussion about the problems associated with the penetration of oxygen and water into the inner layers (cathode and electroluminescent materials) of an OLED device, reference is made to the following documents:

Aziz, H., Popovic, Z. D., Hu, N. X., Hor, A. H., and Xu, G. "Degradation Mechanism of Small Molecule-Based Organic Light-Emitting Devices", Science, 283, pp. 1900-1902, (1999).

Burrows, P. E., Bulovic., V., Forrest, S. R., Sapochak, L. S., McCarty, D. M., Thompson, M. E. "Reliability and Degradation of Organic Light Emitting Devices", Applied Physics Letters, 65(23), pp. 2922-2924.

Kolosov, D., et al., Direct observation of structural changes in organic light emitting devices during degradation. Journal of Applied Physics, 1001. 90(7).

Liew, F. Y., et al., Investigation of the sites of dark spots in organic light-emitting devices. Applied Physics Letters, 1000. 77(17).

Chatham, H., "Review: Oxygen Diffusion Barrier Properties of Transparent Oxide Coatings on Polymeric Substrates", 78, pp. 1-9, (1996).

It is well known that unless something is done to minimize the penetration of oxygen and water into an OLED device, then their operating lifetime will be severely limited. As a result, much effort has been expended to minimize the penetration of oxygen and water into an OLED device so as to help drive the OLED operation towards a 40 kilo-hour lifetime, the level generally regarded as necessary so OLED devices can overtake older device technologies such as LCD displays as discussed in the following document:

Forsythe, Eric, W., "Operation of Organic-Based Light-Emitting Devices, in Society for Information Device (SID) 40th anniversary Seminar Lecture Notes, Vol. 1, Seminar M5, Hynes Convention Center, Boston, Mass., May 20 and 24, (1002).

The more prominent efforts to date that have been performed to help extend the lifetime of OLED devices include gettering, encapsulating and using various sealing techniques. In fact, one common way for sealing an OLED device today is to apply and heat-treat (or UV treat) different types of epoxies, inorganic materials and/or organic materials to form a seal on the OLED device. For example, Vitex Systems manufactures and sells a coating under the brand name of Barix™ which is a composite based approach where alternate layers of inorganic materials and organic materials are used to seal the OLED device. Although these types of seals provide some level of hermetic behavior, they can be very expensive and there are still many instances in which they have failed over time to prevent the diffusion of oxygen and water into the OLED device.

To address this sealing problem, the assignee of the present invention has developed several different sealing techniques in which sealing materials (e.g., low liquidus temperature inorganic materials, $Sn^{2+}$-containing inorganic oxide materials) are used to hermetically seal an OLED device (or other type of device) (see the aforementioned U.S. patent application Ser. Nos. 11/207,691 and 11/803,512). Although these sealing techniques and sealing materials work well to hermetically seal an OLED device (or other types of devices) there is still a desire to improve upon these sealing techniques so that one can decrease the time it takes to hermetically seal an OLED device (or other type of device). This particular need and other needs have been satisfied by the present invention.

SUMMARY

The present invention introduces a sealing method for decreasing the time it takes to hermetically seal a device (e.g., an OLED device). The sealing method includes the steps of: (1) cooling an un-encapsulated device; (2) depositing a sealing material over at least a portion of the cooled device to form an encapsulated device; and (3) heat treating the encapsulated device to form a hermetically sealed device. In one embodiment, the sealing material is a low liquidus temperature inorganic (LLT) material such as, for example, tin-fluorophosphate glass, tungsten-doped tin fluorophosphate glass, chalcogenide glass, tellurite glass, borate glass and phosphate glass. In another embodiment, the sealing material is a $Sn^{2+}$-containing inorganic oxide material such as, for example, SnO, $SnO+P_2O_5$ and $SnO+BPO_4$. An advantage of using this sealing method is that by cooling the un-encapsulated device one can then increase the deposition rate that the sealing material (e.g., LLT material, $Sn^{2+}$-containing inorganic oxide material) is deposited onto the un-encapsulated device which decreases the time, it takes to hermetically seal a device (e.g., an OLED device).

BRIEF DESCRIPTION OF THE DRAWINGS

A more complete understanding of the present invention may be had by reference to the following detailed description when taken in conjunction with the accompanying drawings wherein.

DETAILED DESCRIPTION

Figure 1:
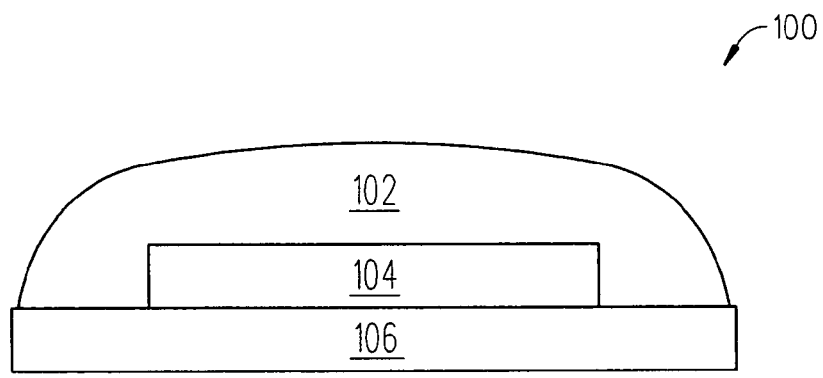
FIG. 1 is a cross-sectional side view of a hermetically sealed device in accordance with the present invention.
Figure 2:
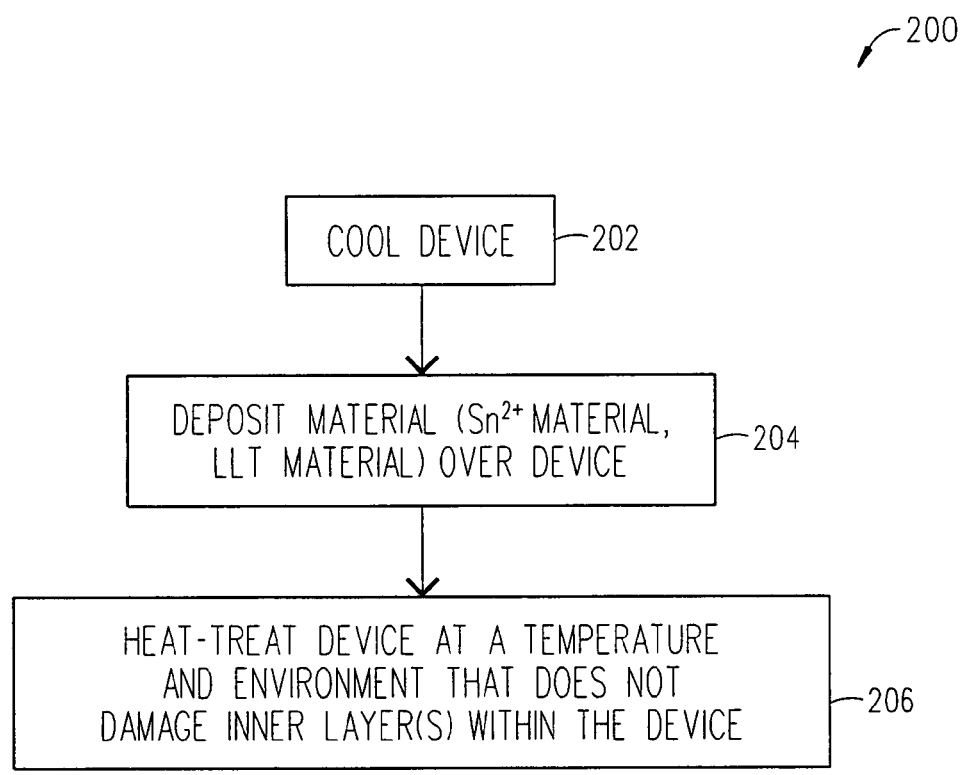
FIG. 2 is a flowchart illustrating the steps of a sealing method for decreasing the time it takes to hermetically seal a device in accordance with the present invention.

Referring to FIGS. 1-2, there are respectively illustrated a cross-sectional side view of a hermetically sealed device 100 and a flowchart of a sealing method 200 used to manufacture the hermetically sealed device 100 in accordance with the present invention. As shown in FIG. 1, the hermetically sealed device 100 includes a heat-treated material 102 (e.g., heat-treated low liquidus temperature inorganic material 102 or heat-treated $Sn^{2+}$-containing inorganic oxide material 102) which encapsulates and hermetically seals one or more inner layers/components 104 that are located on a support/substrate 106.

The sealing method 200 has a cooling step 202 in which the substrate 106 and possibly the inner layer(s)/component(s) 104 of an un-encapsulated device 100 are cooled to a temperature which is (for example): preferably <15° C., more preferably <10° C. and even more preferably <1° C. In addition, the sealing method 200 has a deposition step 204 in which the sealing material 102 (e.g., LLT material 102 or $Sn^{2+}$-containing inorganic oxide material 102) is deposited over the inner layer(s)/component(s) 104 located on top of the cooled support/substrate 106 to form an encapsulated device 100. In one embodiment, the sealing material 102 can be deposited over the cooled inner layer(s)/component(s) 104 and the cooled support/substrate 106 at a deposition rate which is (for example): preferably ~5 Å/second, more preferably ~25 Å/second, and even more preferably ~75 Å/second. Plus, the sealing material 102 can be deposited by using any one of variety of processes including, for example, sputtering, flash evaporation, spraying, pouring, frit-deposition, vapor-deposition, dip-coating, painting, rolling (for example using a film of sealing material 102), spin-coating, a co-evaporation process, a soot gun spraying process, a reactive sputtering process, a laser ablation process, or any combination thereof.

In addition, the sealing method 200 has a heat treatment step 206 in which the encapsulated device 100 is annealed, consolidated or heat-treated (e.g., less than three hours at less than 100° C.) to form the hermetically sealed device 100. The heat treatment step 206 is performed to remove/minimize defects (e.g., pores) within the deposited sealing material 102 which may be formed during the deposition step 204 (note: if $Sn^{2+}$-containing inorganic oxide material 102 is used and in particular SnO then the sputter-deposition step 204 itself may provide all of the heat necessary for sintering the deposited material 102). In one embodiment, the encapsulated device 100 can be heat treated at a temperature which is (for example): preferably <400° C., more preferably <200° C., even more preferably <100° C. and most preferably <40° C. If desired, the cooling step 202, the deposition step 204 and the heat treatment step 206 can all be performed in an inert atmosphere or in a vacuum to help ensure that a water and an oxygen-free condition is maintained throughout the entire sealing process. This type of processing environment helps to ensure the robust, long-life operation of organic electronics 104 (for example) located within the hermetically sealed device 100.

A main advantage of the sealing method 200 is that by cooling the un-encapsulated device 100 one can then increase the deposition rate that the sealing material 102 is deposited onto the un-encapsulated device 100 which decreases the time it takes to hermetically seal the device 100. This is important when one wants to have a high volume operation and manufacture a large number of hermetically sealed devices 100. Examples of hermetically sealed devices 100 include a light-emitting device (e.g., OLED device), a photovoltaic device, a thin-film sensor, an evanescent waveguide sensor, a food container and a medicine container.

If one is manufacturing an OLED device 100, then the inner layers 104 would include cathode and electro-luminescent materials both of which would be located on the substrate 106. These cathode and electro-luminescent materials 104 can be damaged if they are heated above for example 100-125° C. As such, the heat treatment step 206 would not be possible in this particular application if a traditional material (e.g., soda-lime glass) were deposited on the OLED device 100. Because, the temperature (e.g., 600° C.) needed to remove the defects in a traditional material (e.g., soda-lime glass) would be too high and thus severely damage the OLED device's inner layers 104. However, in the present invention, the heat treatment step 206 can be performed in this particular application because the temperature (e.g., 100° C. or less) needed to remove/minimize the defects if any that may be in the deposited sealing material 102 is relatively low so as to not damage the OLED device's inner layers 104. To accomplish this, the sealing material 102 used to encapsulate the cooled device 100 is preferably a low liquidus temperature (LLT) inorganic material 102 or a $Sn^{2+}$-containing inorganic oxide material 102. These sealing materials are briefly discussed below but for a more detailed discussion reference is made to the co-pending U.S. patent application Ser. Nos. 11/207,691 and 11/803,512.

The LLT material 102 can make this all possible because this type of material has a relatively low liquidus temperature ≦1000° C. The low liquidus temperature means that the LLT 102 can be heat treated at a relatively low temperature that does not thermally damage the OLED device's inner layer(s) 104 but still results in a pore-free film being formed on the OLED device 100. Again, it should be appreciated that the heat treated LLT material 102 can also be used as a barrier layer on a wide variety of devices 100 in addition to the OLED device 100 such as, for example, a thin-film sensor, a photovoltaic device, an evanescent waveguide sensor, a food container, a medicine container or any type of electronic device that is sensitive to moisture, oxygen or other gases (note: another LLT material 102 namely tungsten-doped tin fluorophosphate glass could also be used herein and this material was disclosed in co-assigned U.S. patent application Ser. No. 11/544,262—the contents of which are incorporated by reference herein).

In one embodiment, the LLT material 102 has a low liquidus temperature ≦1000° C. (and more preferably ≦600° C. and even more preferably ≦400° C.). The LLT material 102 can include, for example, glass such as tin fluorophosphate glass, tungsten-doped tin fluorophosphate glass, chalcogenide glass, tellurite glass, borate glass and phosphate glass (e.g., alkali Zn or SnZn pyrophosphates). For instance, a preferred tin fluorophosphate glass has the following composition: Sn (20-85 wt %), P (2-20 wt %), O (10-36 wt %), F (10-36 wt %), Nb (0-5 wt %) and at least 75% total of Sn+P+O+F (which can be melted powder targets or sputtered pressed powder targets). These LLT materials 102 are desirable for several different reasons including (for example):
- The LLT material 102 can be devoid of heavy metals and other environmentally undesirable materials.
- The LLT material 102 can be durable and exhibit low dissolution rates when immersed in water at 85° C. (<20 microns per day).
- The LLT material 102 can contain dye molecules and can be doped to levels as high as 8 mM ($4.8 \times 10^{18}$ cm$^{-3}$).
- The LLT phosphate glasses have helium permeability coefficients 4 to 5 orders of magnitude less than that of fused silica.

In addition, the $Sn^{2+}$-containing inorganic oxide material 102 can make this all possible because this type of material has the ability, when consolidated at relatively low temperatures, to form hermetic encapsulated coatings which protect the device 100. The $Sn^{2+}$-containing inorganic oxide materials 102 differ in several respects from the tin fluorophosphate material which was one of the aforementioned LLT materials. First, the $Sn^{2+}$-containing inorganic oxide materials 102 can be heat-treated at a lower temperature than the tin fluorophosphate material (note: the specific tin fluorophosphate material discussed below with respect to FIGS. 3-4 can be heat treated at ~120° C.). Second, the $Sn^{2+}$-containing inorganic oxide materials 102 do not contain fluorine. Thirdly, some of the $Sn^{2+}$-containing inorganic oxide materials 102, such as SnO, have melting temperature in excess of 1000° C., which is greater than the maximum melting temperature of 1000° C. that is associated with the tin fluorophosphate material. Fourthly, the $Sn^{2+}$-containing inorganic oxide materials 102 have different compositions when compared to the tin fluorophosphate material.

The $Sn^{2+}$-containing inorganic oxide materials 102 include compositions such as, for example, SnO powder, blended SnO/$P_2O_5$-containing powders (e.g., 80% SnO+20% $P_2O_5$), and blended SnO/$BPO_4$ powders (e.g., 90% SnO+10% $BPO_4$). However, the $Sn^{2+}$-containing inorganic oxide material 102 can also include blended compositions that had been melted to form the appropriate sputtering target (e.g., 80% SnO+20% $P_2O_5$). In one embodiment, the $Sn^{2+}$-containing inorganic oxide materials 102 include: (1) SnO; (2) SnO and a borate material; (3) SnO and a phosphate material; and (4) SnO and a borophosphate material. Typically, the $Sn^{2+}$-containing inorganic oxide material 102 can contain >50% stannous oxide (and more preferably >70% stannous oxide and even more preferably >80% stannous oxide). Plus, the $Sn^{2+}$-containing inorganic oxide material 102 can be heat treated at <400° C. (and preferably at <200° C. and more preferably at <100° C. and even more preferably at <40° C.).

Figure 3:
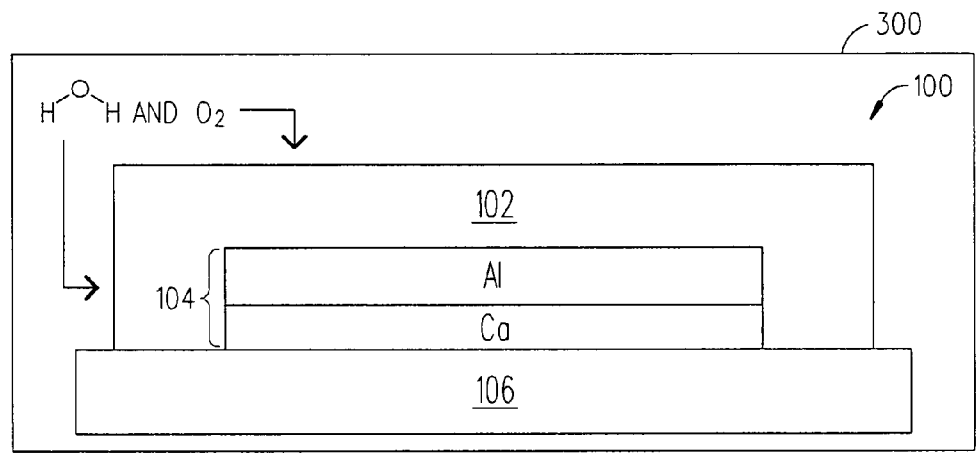
FIG. 3 is a block diagram of an 85° C./85% accelerated-aging chamber/oven which was used to test the hermeticity of three devices which were prepared in a similar manner except that each of them had a different substrate temperature during the deposition of the sealing material.

Referring to FIG. 3, there is a diagram of an 85° C./85% accelerated-aging chamber/oven 300 which was used to test the hermeticity of three devices 100 (calcium patches) which were produced using the same tin fluorophosphate material 102 under the same deposition conditions except that they each had a substrate 106 which had been cooled to a different temperature. As shown, each tested device 100 had a deposited tin fluorophosphate material 102, two inner layers 104 (Al and Ca) and a substrate 106 (glass substrate 106). In particular, each tested device 100 was made by evaporating a 100 nm Ca film 104 on top of a glass substrate 106 (Corning Incorporated's Code 1737). Then, a 150 nm Al layer 104 was evaporated onto the Ca film 104. The Al layer 104 was used because it simulates a cathode which was typically used to produce in-house polymer light emitting diodes (PLEDs). Using a "dual-boat" customized Cressington evaporator 308R (Ted Pella, Calif.), the glass substrate 106 was maintained at 130° C. and approximately $10^{-6}$ Torr during the deposition of the Ca and Al layers 104. After cooling to room temperature, the vacuum was broken and the calcium patches were extracted from the evaporator and placed in a RF sputtering vacuum system which was then pumped to $10^{-6}$ Torr.

The RF sputtering vacuum system had a temperature controlled holder which was used to cool the temperatures of the Ca and Al layers 104 and the substrate 106 (note: the three tested device 100 were respectively maintained at 150° C., 44° C. and 14° C.). The tin fluorophosphate material 102 (which in this case had a composition of 39.6 $SnF_2$, 38.7 SnO, 19.9 $P_2O_5$, 1.8 $Nb_2O_5$ mole percent) was then sputtered onto the Al and Ca layers 104 by an ONYX-3 sputtering gun (Angstrom Sciences, Pa.) under relatively fast RF power deposition conditions (~70 W forward/1 W reflected RF power) and high argon pressure (~20 sccm) (see step 204 in FIG. 2). The sputtering was performed for 2 hours to obtain a film 102 thickness in the range of 3-5 μm. This particular deposition rate was estimated to be in the range of 1-5 Å/second.

Upon completion of the deposition of the Al and CA layers 104, cooling of the substrate 106 was ceased, and an internal plug-heater was switched on for 2 hours to raise the substrate 106 temperature above 100° C. and consolidate the sputtered tin fluorophosphate material 102 (see step 206 in FIG. 2). Next, the vacuum was broken and the heat-treated devices 100 were all placed in the oven 300 and held at 85° C. and 85% relative humidity. In each tested device 100, the Ca layer 104 was initially a highly reflecting metallic mirror. And, if water and/or oxygen penetrated the tin fluorophosphate material 102, then the metallic Ca 104 would react and turn into an opaque white flaky crust which could be quantified with an optical measurement and thus enable one to estimate the amount of time that the encapsulated device 100 could theoretically operate in normal ambient conditions (note: see the aforementioned U.S. patent application Ser. No. 11/207,691 for a more detailed discussion about the now "standardized" calcium patch test). The results of this particular experiment are discussed in detail next with respect to the graph shown in FIG. 4.

Figure 4:
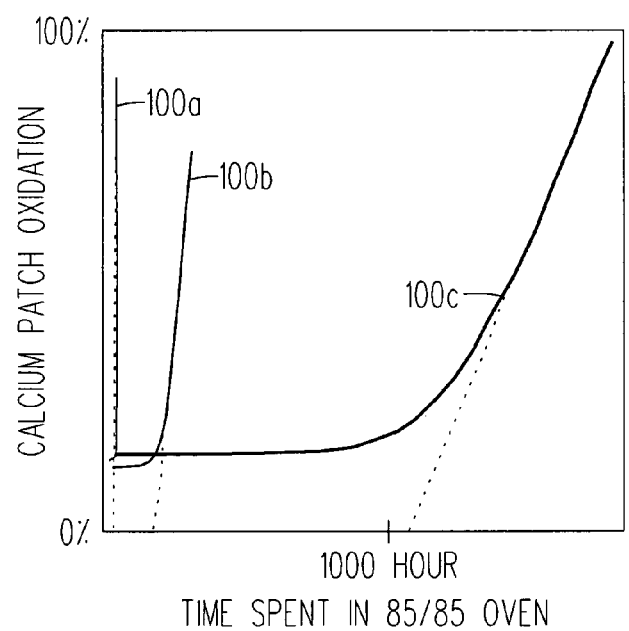
FIG. 4 is a graph which illustrates the performance of the three tested devices which were prepared in a similar manner except that each of them had a different substrate temperature during the deposition of the sealing material.

Referring to FIG. 4, there is a graph which illustrates the performance of the three tested devices 100 which were produced using the same tin fluorophosphate material 102 under the same deposition conditions except that they each had a substrate 106 which had been cooled to a different temperature. In particular, the first device 100a was encapsulated with the tin fluorophosphate material 102 when it had a substrate temperature of 150° C. The second device 100b was encapsulated with the tin fluorophosphate material 102 when it had a substrate temperature of 44° C. And, the third device 100c was encapsulated with the tin fluorophosphate material 102 when it had a substrate temperature of 14° C. The results of this experiment clearly illustrate the superior hermetic barrier property of the sputter deposited tin fluorophosphate material 102 when the substrate 106 had been cooled during the high-rate deposition step 204 (compare the acceptable behavior of the third device 100c to the unacceptable behavior of the first and second devices 100a and 100b). While not wanting to be limited by theory, it is believed that the cooling of the substrate 106 caused smaller grain sizes in the sputtered deposited tin fluorophosphate material 102 which in turn enabled the sputtered deposited tin fluorophosphate material 102 to sinter more readily and form a desirable hermetic film over the third device 100c. In contrast, the first and second devices 100a and 100b were deemed unsatisfactory on the basis of the 85/85 test results because they did not survive 1000 hours within the 85/85 environment. However, the first and second devices 100a and 100b survived the 1000 hours within the 85/85 environment when the tin fluorophosphate material 102 was deposited at a slower rate as was discussed in the aforementioned U.S. patent application Ser. No. 11/207,691.

From the foregoing, it can be readily appreciated by those skilled in the art that the present invention relates to a sealing method 200 for decreasing the time it takes to hermetically seal a device 100 (e.g., an OLED device 100). The sealing method 200 includes the steps of: (1) cooling an un-encapsulated device 100; (2) depositing a sealing material 102 over at least a portion of the cooled device 100 to form an encapsulated device 100; and (3) heat treating the encapsulated device 100 to form a hermetically sealed device 100. The sealing material 102 is a LLT material 102 or a $Sn^{2+}$-containing inorganic oxide material 102. If desired multiple layers of the same or different types of the sealing materials 102 can be deposited on top of the device 100. As discussed above, the sealing material(s) 102 are specifically suited for inhibiting oxygen or/and moisture degradation which is a common problem to a wide variety of devices 100 including electronic devices, food containers and medicine containers. In addition, the sealing material(s) 102 may be used to reduce, for example, photochemical, hydrolytic, and oxidative damage to a device 100 due to chemically active permeants. Some additional advantages and features of using the sealing material(s) 102 are as follows:

A. The sealing materials 102 may be used to prepare hermetic thin film (~2 μm) barrier layers that fulfill the most stringent impermeability requirements for OLED long-lived operation (<$10^{-6}$ water gm/m$^2$ per day), and may be rapidly sputter-deposited and annealed on devices (or substrate materials) and in some cases at extremely low temperatures (<40° C.). The devices 100 include but are not limited to:
  a. Organic electronic devices
    Organic light-emitting diodes (OLED)s
    Organic photovoltaic devices (OPV)s
    Organic Sensors, with or without catalysts
    Flexible substrates for flexible flat panel devices
    Radio frequency identification tags (RFID)s
  b. Semiconductor electronic devices
    Light-emitting diodes (LED)s
    Photovoltaic devices (PV)s
    Sensors, with or without catalysts
    Flexible substrates for flexible flat panel devices
    Radio frequency identification tags (RFID)s
The substrate materials include but are not limited to:
  a. Polymer Materials
    Flexible substrates for flexible flat panel devices
    Food packaging
    Medical packaging B. The sealing of organic electronic devices 100 with these particular sealing materials 102 requires no introduction of oxygen or air into the chamber during the consolidation/heat treatment. The fact that no outside oxidizing source is required to enable the sealing event, especially at low temperatures (~40° C.), makes this sealing technique an attractive feature for making organic electronic devices. This is especially true since it is well known that oxygen and moisture are the principal degrading reactants associated with the redox and photo-bleaching degradation reactions that adversely affect the organic layers and/or cathode materials located within organic electronic devices like an OLED.

C. Sputter deposition, evaporation, and other thin film deposition processes may be used to deposit the sealing material 102. For example, high rate deposition of $Sn^{2+}$-containing inorganic oxide films 102 may be produced by evaporation of metallic tin in an oxygen containing environment onto a rolling substrate such as plastic at very high speed. Alternatively, reactive DC sputtering of metallic tin in an oxygen environment may be used to produce the desired high rate deposition of a $Sn^{2+}$-containing inorganic oxide film onto a device 100. In fact, many different thin film deposition techniques may be used to deposit the $Sn^{2+}$-containing inorganic oxide film 102 (and the LLT film 102) onto the device 100.

D. The sealing material 102 can be batched with different powders/dopants to create a composition designed to achieve a specific physical-chemical property in the deposited barrier layer. Following is an exemplary list of various dopants that can be mixed with the sealing material 102 to achieve a desired physico-chemical property within the deposited barrier layer:
  a. Opacity-Transparency: For instance, SnO is opaque at visible wavelengths, but it may be doped with components such as phosphates to yield transparent films.
  b. Refractive Index: Dopants such as $P_2O_5$, $BPO_4$ and $PbF_2$ can be used to alter the refractive index of the sealing material 102 to help optimize, for instance, the light transmission and/or light extraction of the device 100. For example, OLED devices 100 with top emission can be optimized when the air gaps therein are replaced with an index-matched oxide material.
  c. Coefficient of Thermal Expansion (CTE): Dopants such as $SnF_2$, $P_2O_5$ and $PbF_2$ can be used to alter the CTE of the sealing material 102 which can help to minimize the different forms of delamination which are commonly associated with "CTE mismatch" problems.
  d. Sensitization: Phosphors, quantum dots, inorganic/organic dyes and molecules may be added to confer desired electro-optic characteristics which are useful for device optimization. For instance, dopants such as carbon black can be used to alter the electro-optic character (Fermi level/resistivity) of the sealing material 102 to improve the efficiency of the hermetically sealed device 100 (note: if the Fermi level can be shifted substantially then this might enable one to alter the conductivity of the barrier film in a manner which is analogous to the known indium-tin-oxide (ITO) systems).
  e. Alter Solubility and Interface Wettability for Better Adhesion: Doping the sealing material 102 with dopants, such as $SnF_2$, enables one to alter the miscibility of the deposited barrier film. In desired, this concept may be further exploited for adhesion purposes by altering the surface wet-ability of the sealing material 102.
  f. Scratch Resistant: Dopants such as SnO, $SnF_2$ and $PbF_2$ may be used to confer a hardness in the sealing material 102 which may be desirable for various devices 100.

E. Pattern-Ability: Sputter deposition, or other thin film deposition methods, allow different patterning techniques to be used, such as shadow masking etc., to produce microstructures having specific dielectric properties to help optimize the operation of the device 100 (e.g., an organic thin film transistor (TFT) device 100 could have insulator gates formed thereon to help achieve a good voltage threshold value).

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

The invention claimed is:

1. A method for hermetically sealing an organic electronic device, said method comprising the steps of:

cooling an un-encapsulated organic electronic device;
sputtering a target material consisting of SnO and $P_2O_5$ to deposit a single thin film layer of a sealing material over at least a portion of said cooled organic electronic device to form an encapsulated organic electronic device; and
wherein the thin film sealing material layer is transparent at visible wavelengths and forms a hermetic barrier on the encapsulated organic electronic device.

2. The method of claim 1, wherein said cooling step further includes cooling said un-encapsulated organic electronic device to a temperature <10° C.

3. The method of claim 1, wherein said sputtering step further includes depositing the sealing material at a deposition rate of about 5 Å/second over said at least a portion of said cooled organic electronic device.

4. The method of claim 1, wherein said deposition step further includes depositing the sealing material at a deposition rate of about 25 Å/second over said at least a portion of said cooled organic electronic device.

5. The method of claim 1, wherein said deposition step further includes depositing the sealing material at a deposition rate of about 75 Å/second over said at least a portion of said cooled organic electronic device.

6. The method of claim 1, wherein said hermetic barrier has an oxygen permeance of less than 0.01 cc/$m^2$/atm/day and a water permeance of less than 0.01 g/$m^2$/day.

7. The method of claim 1, wherein the thin film sealing material layer contains greater than 80% SnO.

8. A method for hermetically sealing an organic light emitting diode device, said method comprising the steps of:
cooling an un-encapsulated organic light emitting diode device comprising an electro-luminescent material to a temperature less than 15° C.;
sputtering a target material consisting of SnO and $P_2O_5$ to deposit a single thin film layer of a sealing material over at least a portion of said cooled un-encapsulated organic light emitting diode device to form an encapsulated organic light emitting diode device; and
wherein said thin film sealing material layer is transparent at visible wavelengths and forms a pore-free barrier layer on the encapsulated organic light emitting diode device having an oxygen permeance less than 0.01 cc/$m^2$/atm/day and a water permeance less than 0.01 g/$m^2$/day.

9. The method of claim 8, wherein a thickness of said barrier layer is about 2 μm.

10. The method of claim 8, wherein a liquidus temperature of said barrier layer is less than 600° C.

11. The method according to claim 9, wherein said target material is a pressed powder material.

* * * * *